United States Patent [19]

Sakai et al.

[11] Patent Number: 4,878,960
[45] Date of Patent: Nov. 7, 1989

[54] PROCESS FOR PREPARING ALLOYED-ZINC-PLATED TITANIUM-KILLED STEEL SHEET HAVING EXCELLENT DEEP-DRAWABILITY

[75] Inventors: Nobuhiko Sakai; Yukio Uchida, both of Amagasaki; Eizo Wada, Izumisano; Yusuke Hirose, Osaka-Sayama, all of Japan

[73] Assignee: Nisshin Steel Company, Ltd., Tokyo, Japan

[21] Appl. No.: 307,673

[22] Filed: Feb. 6, 1989

[51] Int. Cl.$^4$ ............................................. C23C 16/02
[52] U.S. Cl. .................................... 148/127; 427/250; 427/321; 427/383.9
[58] Field of Search ........................ 148/11.5 Q, 127; 428/659, 938; 427/250, 321, 383.9

[56] References Cited

U.S. PATENT DOCUMENTS

| | | | |
|---|---|---|---|
| 4,287,008 | 9/1981 | Torok et al. | 427/383.9 |
| 4,330,598 | 5/1982 | Lee et al. | 428/659 |
| 4,350,540 | 9/1982 | Allegra et al. | 428/659 |

FOREIGN PATENT DOCUMENTS

| | | | |
|---|---|---|---|
| 73431 | 6/1978 | Japan | 148/127 |
| 73825 | 6/1980 | Japan | 148/127 |
| 73826 | 6/1980 | Japan | 148/127 |

Primary Examiner—Robert McDowell
Attorney, Agent, or Firm—Webb, Burden, Ziesenheim & Webb

[57] ABSTRACT

There is disclosed a process for preparing alloyed-zinc-plated steel sheet having excellent deep drawability, which comprises adjusting the temperature of substrate steel sheet of titanium-killed steel essentially consisting of C≦0.01%, Si<0.15%, Mn: 0.15–0.85%, Ti: 0.05–0.30%, P≦0.02%, S≦0.02%, Al≦0.05% and balance of Fe, to a temperature within a temperature range T(°C.) defined as $180 \leq T \leq -240 \times W + 292$, wherein W(%) is the Ti content of the substrate steel sheet, subjecting said steel sheet to Zn-plating by vacuum vapor deposition, and thereafter maintaining the plated steel sheet for alloying the plating zinc layer and the substate steel at 220°~320° C. for 1–50 hours in accordance with Ti content of the substrate steel. This process provided alloyed zinc-plated steel sheets having excellent drawability and powdering resistance.

1 Claim, 1 Drawing Sheet

PROCESS FOR PREPARING ALLOYED-ZINC-PLATED TITANIUM-KILLED STEEL SHEET HAVING EXCELLENT DEEP-DRAWABILITY

FIELD OF THE INVENTION

This invention relates to a process for preparing alloyed-zinc(Zn)-plated titanium(Ti)-killed steel sheet having excellent deep-drawability (good workability and powdering resistance) by vacuum vapor deposition.

BACKGROUND OF THE INVENTION

An alloyed plated steel sheet such as an alloyed-Zn-plated steel sheet is better than ordinary (Zn-)plated steel sheet in that continuous spot-welding can be easily carried out, the adhesion of electrophoretic coating film is good, the corrosion resistance is better, etc. and, therefore, sheet of this type is being widely used in the automobile industry and other fields.

Conventionally, alloyed-Zn-plated steel sheet is manufactured by heat-treating Zn-plated steel sheet prepared by hot-dip plating or electrolytic plating. However, hot-dip plating is not suitable for thin coating of less than 30 g/m$^2$ and one side plating, and hot-dip-plated steel sheet is inferior in uniformity in thickness of the plating layer in the londitudinal direction and the transverse direction. Electrolytic plating is not suitable for plating of thicker than 50 g/m$^2$ because the plating cost rises steeply with the increase in coating weight. In contrast, the vacuum vapor deposition process is advantageous in that the coating weight can be relatively easily controlled and uniform thickness is easily achieved. Therefore, processes for preparing alloyed Zn-plated steel sheet utilizing vacuum vapor deposition have been proposed and being practiced (JP-A-61-195965 for instance). According to this process, cold-rolled steel coil is plated with Zn on one or both sides by vacuum vapor deposition and, thereafter, is heat-treated for alloying at 250°–350° C. for 1–15 hours in a non-oxidizing or weakly reducing atmosphere in a batch annealing furnace.

In the meanwhile, for manufacturing steel sheets for deep-drawing, aluminum(Al)-killed steel and Ti-killed steel are used. With Al-killed steel sheet, alloyed-Zn-plated steel sheet can be manufactured by vacuum vapor deposition and heat treatment in accordance with the above-described known process. With Ti-killed steel sheet, however, there is a problem that the formed alloy layer is inferior in powdering resistance and easily scales off.

For ordinary deep drawing purposes, Al-killed steel sheet suffices. Recently, however, more and more complicated shaping is being required. For such purposes, Ti-killed steel, which has better workability and formability, must be used. Therefore, alloyed-Zn-plated steel sheet made of Ti-killed steel sheet also must be provided with good powdering resistance.

We have conducted studies to determine the cause of the inferior powdering resistance of alloyed-Zn-plated steel sheet made of Ti-killed steel sheet focusing our attention on the structure of alloyed plating layer. As a result of our studies, we have found that in the case of Ti-killed steel, very brittle intermetallic compounds of iron(Fe) and Zn are formed when the Zn-plated steel sheet is heated to temperatures outside of a specific temperature range and that this specific temperature range differs depending upon the Ti content. That is, the temperature is in excess of 320° C. when the Ti content is 0.05% and in excess of 260° C. when the Ti content is 0.3%. Further, once a brittle intermetallic compound layer is formed, deterioration of powdering resistance is inevitable irrespective of the alloying conditions under which the plated steel sheet is treated. Thus we have found that the aforesaid problem can be solved by maintaining the substrate Ti-killed steel sheet at a low temperature set relative to the Ti content during the vacuum vapor deposition and heating the plated steel sheet in a non-oxidizing atmosphere, preferably in a batch heat treatment annealing furnace, at a temperature within the temperature range in which the Fe content of the formed alloyed layer is wisthin a prescribed range.

SUMMARY OF THE INVENTION

This invention provides a process for preparing alloyed-zinc-plated steel sheet having excellent deep drawability, which comprises adjusting the temperature of substrate steel sheet of titanium-killed steel essentially consisting of C$\leq$0.01%, Si<0.15%, Mn: 0.15–0.85%, Ti: 0.05–0.30%, P$\leq$0.02%, S$\leq$0.02%, Al$\leq$0.05% and balance of Fe, to a temperature within a range T(°C.) defined as $180 \leq T \leq -240 \times W + 292$, wherein W(%) is the Ti content of the substrate steel sheet, subjecting said steel sheet to Zn-plating by vacuum vapor deposition, and thereafter maintaining the plated steel sheet for alloying the plating zinc layer and the substrate steel at 220°–320° C. for 1–50 hours in accordance with Ti content.

Throughout the specification, percent(%) means that by weight.

Ti-killed steel for manufacturing steel sheet suitable for deep-drawing is a low carbon(C) steel, the C content of which is usually not more than 0.01%. The silicon(Si) content should preferably be less than 0.15% because with a Si content in excess of 0.15% the adhesion of plating layer is unsatisfactory. Manganese(Mn), an element which enhances the strength of steels, should preferably be contained in the range of 0.15–0.85%. When the Mn content is less than 0.15%, satisfactory strength is not obtained. On the other hand, the strength of steels is not further improved by a Mn content in excess of 0.85%. The Ti content in Ti-killed steel for manufacturing sheet for deep drawing is usually 0.05–0.30%. Ti is an element which fixes C in steel and improves workability of the steel and is thought to be required in an amount of at least about four times the content of C. This element also fixes nitrogen(N) which is an impurity in steel. Therefore, Ti is contained in an amount in excess of 0.05% or more in consideration of the N content. On the other hand, no advantage commensurate with the rise in the manufacturing cost is obtained if the Ti content is in excess of 0.3%.

As impurities, phosphorus(P), sulfur(S) and Al may be contained respectively in an amount of $\leq$0.02%, $\leq$0.02% and $\leq$0.05%. These amounts are the same as the ordinary impurity contents of plain carbon steels.

The above-described Ti-killed steel sheet is maintained at a temperature T(°C.) defined as $180 \leq T \leq -240 \times W + 292$ in accordance with the Ti content W(%) and then subjected to plating with Zn by vacuum vapor deposition.

In vacuum vapor deposition plating, Zn vapor which condenses on the surface of the steel strip to form a plating layer raises the temperature of the steel strip by 40° C. at most. If the temperature of the substrate steel(T) of Ti-killed steel exceeds the temperature defined as $180 \leq T \leq -240 \times W + 292$ in accordance with the Ti content W(%) before being subjected to vacuum vapor deposition, during vacuum vapor deposition, the temperature of the steel sheet reaches a temperature at which brittle intermetallic compounds are formed because of temperature rise caused by heat of condensation of the Zn vapor. Thus the powdering resistance of the formed alloyed layer deteriorates.

The upper limit of the substrate temperature differs depending upon Ti content as described above. Specifically, when the Ti content is 0.3%, it is not higher than 220° C. as calculated by the above formula; and when the Ti content is 0.05%, it is not higher than 280° C. That is, the substrate temperature must be adjusted so as not to exceed the upper limit as defined by the above formula prior to vacuum vapor deposition.

If the substrate temperature is too low, the adhesion of the formed plating Zn layer is poor. The lower limit is 180° C. which is the same as in the case of plain carbon steel containing no Ti.

The steel strip plated with Zn by vacuum vapor deposition is heat-treated for alloying. The formed alloyed layer should preferably contain 8~12% of Fe. If the Fe content is less than 6%, unalloyed η-Zn remains on the surface of the plating layer and affects the coatability, weldability, etc. of the plated steel sheet. If the Fe content exceeds 14%, the powdering resistance of the alloyed layer deteriorates.

As the heating means, a batch annealing furnace can be used. In the alloying treatment with a batch annealing furnace, generally steel sheets are heated in a non-oxidizing atmosphere in order to prevent oxidation of the steel strip (or sheet). Heating can be carried out with a strip in the form of a coil, a tight coil or an open coil.

The heating temperature and time can be varied in accordance with intended coating weight and average Fe content, but the heating temperature must be lower by 30° C. than the alloying temperature for Zn-plated Ti-free steel sheet. The upper limit of the heating temperature varies depending upon the Ti content. It is 280° C. when the Ti content is 0.3%, and is 320° C. when the Ti content is 0.05%. If the heating temperature exceeds the above-described upper limit, powdering resistance deteriorates, since brittle alloyed layer is formed. On the other hand, if the heating temperature is below the above-described temperature range, the Zn plating layer is not well alloyed. Heating for shorter than one hour does not fully raise the substrate temperature and satisfactory heating cannot be effected. On the other hand, heating for longer than 50 hours lowers productivity.

It is possible to continuously carry out heating by means of an annealing furnace provided in a continuous plating line, but the heating conditions will differ from those in the case of a batch annealing furnace. Employment of a batch annealing furnace is preferred since temperature control is easy.

The temperature raising rate and cooling rate are not specifically limited and these conditions are determined with consideration to the performance of ordinary industrial batch annealing furnaces.

BRIEF EXPLANATION OF THE ATTACHED DRAWINGS

SPECIFIC DESCRIPTION OF THE INVENTION

Now the invention will be specifically described by way of experimental results, working examples and comparative examples.

We plated ordinary Ti-killed steel strips containing 0.05~0.3% Ti with Zn by vacuum vapor deposition using a continuous vacuum vapor deposition apparatus as disclosed in Nisshin Giho No. 51,1954, 1984 with various substrate temperatures.

The other operation conditions were as follows:
Steel strip: 0.8 mm thick and 1200 mm wide Ti-killed steel strips
Operation speed: 80 m/min
Pressure in the deposition chamber: 0.01 Torr
Alloying temperature: 270° C.

Thus we checked the relation between Ti content of substrate steels and substrate temperature for obtaining an alloyed layer containing no intermetallic compounds. The results are summarized in FIG. 1.

Figure 1:
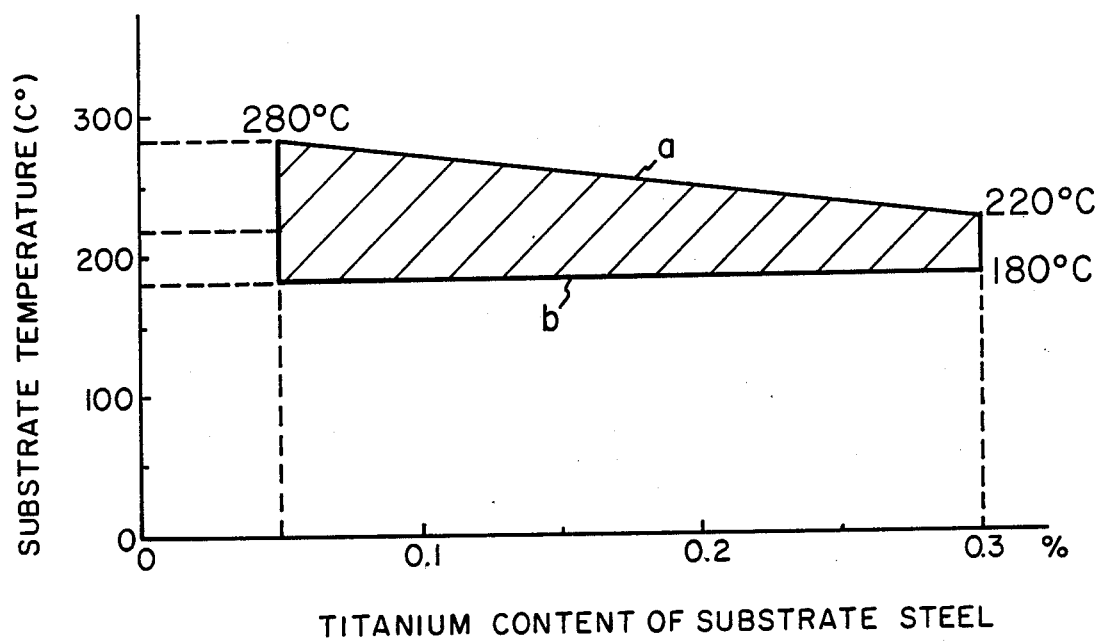
FIG. 1 is a diagram showing the ranges of substrate sheet temperature and Ti contents in substrate steel in which brittle Fe-Zn intermetallic compounds are not formed at the interface of the steel substrate and the plating layer when the substrate is plated with Zn by vacuum vapor deposition.

FIG. 1 shows ranges of substrate temperature and Ti content in substrate steel in which formation of Fe-Zn intermetallic compounds does not occur at the interface of the substrate and the plating layer. In the drawing, the solid line a represents upper limit temperatures below which brittle Fe-Zn intermetallic compounds are not formed. The line is expressed by the relation $T = -240 \times W + 292 (° C)$, wherein T is the substrate temperature in °C. and W is Ti content in %. The solid line b represents lower limit temperatures above which the adhesion of the formed plating layer is satisfactory. This temperature is constantly 180° C. regardless of Ti content.

The Zn-plated steel strips prepared as described above (not yet alloyed) were maintained at various temperatures for various times and Fe contents of the formed alloy layers were checked. It was found that there is a relation between the Ti content and the upper limit temperature. The results are summarized in FIG. 2.

Figure 2:
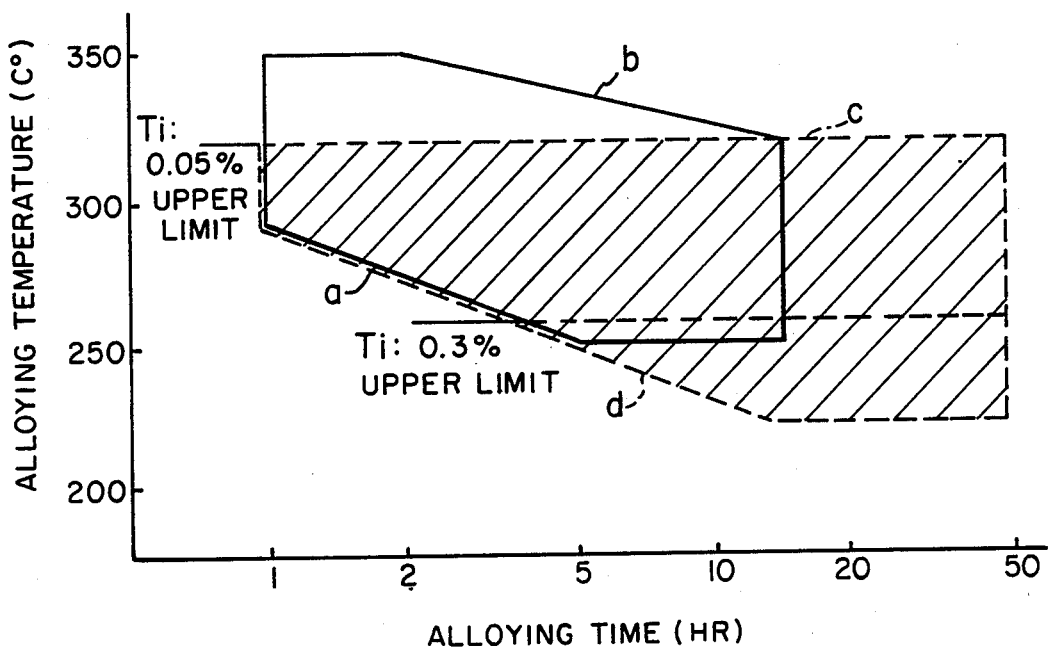
FIG. 2 is a diagram showing ranges of treating temperature and time in which the average Fe in the alloyed layer can be controlled to 8~12.0%.

FIG. 2 is a diagram which shows ranges of heat-treating temperatures and times in which the average Fe content in the alloyed layer can be controlled to 8–12.0%. In the drawing, the area surrounded by broken lines is the range in which the Fe content of the formed alloy layer falls between 8% and 12%. As seen in this figure, the strip can be heated to 320° C. when the Ti content is 0.05% and 280° C. when the Ti content is 0.3%. Those skilled in the art will be able to determine the upper limit temperature for Ti contents between 0.05% and 0.3% from this figure. The Fe content of the alloyed layer of Ti-killed steel sheet falls between 8% and 12% when the Zn-plated steel sheet is heated at 220°–320° C. according to the Ti content.

In FIG. 2, the area surrounded by solid lines is the range known for Al-killed steel. That is, the sloped line on the bottom left side is known by those skilled in the art.

EXAMPLES AND COMPARATIVE EXAMPLES

The above-described Ti-killed steel strips containing 0.05% and 0.3% were plated with Zn on both sides by vacuum vapor deposition as described above under various conditions indicated in Table 1.

The thus Zn-plated steel coils were heat treated for alloying in a batch annealing furnace in an atmosphere consisting of 3% $H_2$ and 97% $N_2$ and having a dew point (D.P.) of $-25°$ C. under the temperature and time conditions indicated in Table 1.

The surface condition and powdering resistance of the thus produced alloyed Zn-plated steel sheets were checked. The powdering resistance was judged by bending specimens with a radius of curvature of 3 times the thickness of the sheet up to 180° (6t bending) and observing whether scaling-off of the plating layers took place inside or not.

The results are summarized in Table 1. The terms used 1 means as follows:
With respect to surface condition,
Good: Homogeneous alloy were formed.
Zn remaining: $\eta$-Zn remained.
With respect to powdering resistance,
Good: No powdering occurred.
Poor: Powdering occurred.
Poor adhesion: Plating layer easily peeled off.

The asterisked values are outside the conditions defined in the claim.

As is apparent from the above-described results, the products of the present invention were provided with good surface conditions and powdering resistance, while the products of the comparative examples were inferior because of the existence of unalloyed Zn or formation of intermetallic compounds.

TABLE 1

| Run | Coating Weight (g/m$^2$) | Ti cont. of Substrate (wt %) | Upper limit of substrate temp. ($-240$ W $+292$) °C. | Substrate temp. (°C.) | Substrate temp. after plating (°C.) | Alloying temp. (°C.) | Alloying time (hr) | Surface condition | Powdering resistance |
|---|---|---|---|---|---|---|---|---|---|
| Ex. | | | | | | | | | |
| 1 | 10/10 | 0.05 | 280 | 180 | 184 | 280 | 1 | good | good |
| 2 | 10/10 | 0.05 | 280 | 180 | 184 | 320 | 1 | ↓ | ↓ |
| 3 | 10/10 | 0.05 | 280 | 180 | 184 | 320 | 50 | ↓ | ↓ |
| 4 | 10/10 | 0.05 | 280 | 180 | 184 | 220 | 15 | ↓ | ↓ |
| 5 | 10/10 | 0.05 | 280 | 180 | 184 | 220 | 50 | ↓ | ↓ |
| 6 | 10/10 | 0.05 | 280 | 280 | 284 | 280 | 1 | ↓ | ↓ |
| 7 | 10/10 | 0.05 | 280 | 280 | 284 | 320 | 1 | ↓ | ↓ |
| 8 | 10/10 | 0.05 | 280 | 280 | 284 | 320 | 50 | ↓ | ↓ |
| 9 | 10/10 | 0.05 | 280 | 280 | 284 | 220 | 15 | ↓ | ↓ |
| 10 | 10/10 | 0.05 | 280 | 280 | 284 | 220 | 50 | ↓ | ↓ |
| 11 | 10/10 | 0.30 | 220 | 180 | 184 | 260 | 3 | ↓ | ↓ |
| 12 | 10/10 | 0.30 | 220 | 180 | 184 | 260 | 50 | ↓ | ↓ |
| 13 | 10/10 | 0.30 | 220 | 180 | 184 | 220 | 15 | ↓ | ↓ |
| 14 | 10/10 | 0.30 | 220 | 180 | 184 | 220 | 50 | ↓ | ↓ |
| 15 | 10/10 | 0.30 | 220 | 220 | 224 | 260 | 3 | ↓ | ↓ |
| 16 | 10/10 | 0.30 | 220 | 220 | 224 | 260 | 50 | ↓ | ↓ |
| 17 | 10/10 | 0.30 | 220 | 220 | 224 | 220 | 15 | good | good |
| 18 | 10/10 | 0.30 | 220 | 220 | 224 | 220 | 50 | good | good |
| 19 | 50/50 | 0.05 | 280 | 180 | 200 | 280 | 1 | ↓ | ↓ |
| 20 | 50/50 | 0.05 | 280 | 180 | 200 | 320 | 1 | ↓ | ↓ |
| 21 | 50/50 | 0.05 | 280 | 180 | 200 | 320 | 50 | ↓ | ↓ |
| 22 | 50/50 | 0.05 | 280 | 180 | 200 | 220 | 15 | ↓ | ↓ |
| 23 | 50/50 | 0.05 | 280 | 180 | 200 | 220 | 50 | ↓ | ↓ |
| 24 | 50/50 | 0.05 | 280 | 280 | 300 | 280 | 1 | ↓ | ↓ |
| 25 | 50/50 | 0.05 | 280 | 280 | 300 | 320 | 1 | ↓ | ↓ |
| 26 | 50/50 | 0.05 | 280 | 280 | 300 | 320 | 50 | ↓ | ↓ |
| 27 | 50/50 | 0.05 | 280 | 280 | 300 | 220 | 15 | ↓ | ↓ |
| 28 | 50/50 | 0.05 | 280 | 280 | 300 | 220 | 50 | ↓ | ↓ |
| 29 | 50/50 | 0.30 | 220 | 180 | 200 | 260 | 3 | ↓ | ↓ |
| 30 | 50/50 | 0.30 | 220 | 180 | 200 | 260 | 50 | ↓ | ↓ |
| 31 | 50/50 | 0.30 | 220 | 180 | 200 | 220 | 50 | ↓ | ↓ |
| 32 | 50/50 | 0.30 | 220 | 180 | 200 | 220 | 15 | ↓ | ↓ |
| 33 | 50/50 | 0.30 | 220 | 220 | 240 | 260 | 3 | ↓ | ↓ |
| 34 | 50/50 | 0.30 | 220 | 220 | 240 | 260 | 50 | ↓ | ↓ |
| 35 | 50/50 | 0.30 | 220 | 220 | 240 | 220 | 15 | good | good |
| 36 | 50/50 | 0.30 | 220 | 220 | 240 | 220 | 50 | good | good |
| 37 | 100/100 | 0.05 | 280 | 180 | 220 | 280 | 1 | ↓ | ↓ |
| 38 | 100/100 | 0.05 | 280 | 180 | 220 | 320 | 1 | ↓ | ↓ |
| 39 | 100/100 | 0.05 | 280 | 180 | 220 | 320 | 50 | ↓ | ↓ |
| 40 | 100/100 | 0.05 | 280 | 180 | 220 | 220 | 15 | ↓ | ↓ |
| 41 | 100/100 | 0.05 | 280 | 180 | 220 | 220 | 60 | ↓ | ↓ |
| 42 | 100/100 | 0.05 | 280 | 280 | 320 | 280 | 1 | ↓ | ↓ |
| 43 | 100/100 | 0.05 | 280 | 280 | 320 | 320 | 1 | ↓ | ↓ |
| 44 | 100/100 | 0.05 | 280 | 280 | 320 | 320 | 50 | ↓ | ↓ |
| 45 | 100/100 | 0.05 | 280 | 280 | 320 | 220 | 15 | ↓ | ↓ |
| 46 | 100/100 | 0.05 | 280 | 280 | 320 | 220 | 50 | ↓ | ↓ |
| 47 | 100/100 | 0.30 | 220 | 180 | 220 | 260 | 3 | ↓ | ↓ |
| 48 | 100/100 | 0.30 | 220 | 180 | 220 | 260 | 50 | ↓ | ↓ |
| 49 | 100/100 | 0.30 | 220 | 180 | 220 | 220 | 15 | ↓ | ↓ |
| 50 | 100/100 | 0.30 | 220 | 180 | 220 | 220 | 50 | ↓ | ↓ |
| 51 | 100/100 | 0.30 | 220 | 220 | 260 | 260 | 3 | ↓ | ↓ |
| 52 | 100/100 | 0.30 | 220 | 220 | 260 | 260 | 50 | ↓ | ↓ |
| 53 | 100/100 | 0.30 | 220 | 220 | 260 | 220 | 15 | good | good |
| 54 | 100/100 | 0.30 | 220 | 220 | 260 | 220 | 50 | good | good |
| Comp. | | | | | | | | | |

TABLE 1-continued

| Run | Coating Weight (g/m$^2$) | Ti cont. of Substrate (wt %) | Upper limit of substrate temp. (−240 W +292) °C. | Substrate temp. (°C.) | Substrate temp. after plating (°C.) | Alloying temp. (°C.) | Alloying time (hr) | Surface condition | Powdering resistance |
|---|---|---|---|---|---|---|---|---|---|
| Ex. | | | | | | | | | |
| 1 | 10/10 | 0.05 | 280 | 160* | 164 | 280 | 20 | Zn remains | Poor adhesion |
| 2 | 10/10 | 0.05 | 280 | 330* | 334 | 280 | 20 | good | poor |
| 3 | 10/10 | 0.05 | 280 | 240 | 244 | 350* | 1 | good | poor |
| 4 | 10/10 | 0.05 | 280 | 240 | 244 | 200* | 50 | Zn remains | good |
| 5 | 10/10 | 0.30 | 220 | 160* | 164 | 240 | 20 | Zn remains | Poor adhesion |
| 6 | 10/10 | 0.30 | 220 | 330* | 334 | 240 | 20 | good | poor |
| 7 | 10/10 | 0.30 | 220 | 200 | 204 | 350* | 1 | good | poor |
| 8 | 10/10 | 0.30 | 220 | 200 | 204 | 200* | 50 | Zn remains | good |
| 9 | 50/50 | 0.05 | 280 | 160* | 180 | 280 | 20 | Zn remains | Poor adhesion |
| 10 | 50/50 | 0.05 | 280 | 330* | 350 | 280 | 20 | good | poor |
| 11 | 50/50 | 0.05 | 280 | 240 | 260 | 350* | 1 | good | poor |
| 12 | 50/50 | 0.05 | 280 | 240 | 260 | 200* | 50 | Zn remains | good |
| 13 | 50/50 | 0.30 | 220 | 160* | 180 | 240 | 20 | Zn remains | Poor adhesion |
| 14 | 50/50 | 0.30 | 220 | 330* | 350 | 240 | 20 | good | poor |
| 15 | 50/50 | 0.30 | 220 | 200 | 220 | 350* | 1 | good | poor |
| 16 | 50/50 | 0.30 | 220 | 200 | 220 | 200* | 50 | Zn remains | good |
| 17 | 100/100 | 0.05 | 280 | 160* | 200 | 280 | 20 | Zn remains | Poor adhesion |
| 18 | 100/100 | 0.05 | 280 | 330* | 370 | 280 | 20 | good | poor |
| 19 | 100/100 | 0.05 | 280 | 240 | 280 | 350* | 1 | good | poor |
| 20 | 100/100 | 0.05 | 280 | 240 | 280 | 200* | 50 | Zn remains | good |
| 21 | 100/100 | 0.30 | 220 | 160* | 200 | 240 | 20 | Zn remains | Poor adhesion |
| 22 | 100/100 | 0.30 | 220 | 330* | 370 | 240 | 20 | good | poor |
| 23 | 100/100 | 0.30 | 220 | 200 | 240 | 350* | 1 | good | poor |
| 24 | 100/100 | 0.30 | 220 | 200 | 240 | 200* | 50 | Zn remains | good |

*Outside of the claimed condition

We claim:

1. A process for preparing alloyed-zinc-plated steel sheet having excellent deep drawability, which comprises adjusting the temperature of substrate steel sheet of titanium-killed steel essentially consisting of $C \leqq 0.01\%$, $Si < 0.15\%$, Mn: 0.15–0.85%, Ti: 0.05–0.30% $P \leqq 0.02\%$, $S \leqq 0.02\%$, $Al \leqq 0.05\%$ and balance of Fe, to a temperature within a temperature range T(°C.) defined as $180 \leqq T \leqq -240 \times W + 292$, wherein W(%) is the Ti content of the substrate steel sheet, subjecting said steel sheet to Zn-plating by vacuum vapor deposition, and thereafter maintaining the plated steel sheet for alloying the plating zinc layer and the substrate steel at 220°–320° C. for 1~50 hours in accordance with Ti content of the substrate steel.

* * * * *